(12) United States Patent
Yanagihara et al.

(10) Patent No.: US 8,592,866 B2
(45) Date of Patent: Nov. 26, 2013

(54) TRANSISTOR

(75) Inventors: Manabu Yanagihara, Osaka (JP); Masahiro Hikita, Hyogo (JP); Tetsuzo Ueda, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 948 days.

(21) Appl. No.: 11/600,102

(22) Filed: Nov. 16, 2006

(65) Prior Publication Data
US 2007/0176215 A1    Aug. 2, 2007

(30) Foreign Application Priority Data
Jan. 27, 2006    (JP) .................................. 2006-019601

(51) Int. Cl.
H01L 29/66    (2006.01)

(52) U.S. Cl.
USPC ............ 257/194; 257/E21.403; 257/E29.249; 438/172

(58) Field of Classification Search
USPC ............ 257/76, 194, 195, 200, 201, E21.403, 257/E29.246, E29.249, E29.252; 438/22, 438/167, 172, 285, 590
See application file for complete search history.

(56) References Cited

U.S. PATENT DOCUMENTS

| | | | |
|---|---|---|---|
| 4,830,980 A * | 5/1989 | Hsieh ............................. | 438/169 |
| 5,391,869 A * | 2/1995 | Ade et al. ................. | 250/227.24 |
| 5,663,580 A * | 9/1997 | Harris et al. ..................... | 257/77 |
| 6,028,328 A * | 2/2000 | Riechert et al. ................ | 257/194 |
| 6,046,464 A * | 4/2000 | Schetzina ........................ | 257/96 |
| 6,064,082 A * | 5/2000 | Kawai et al. .................. | 257/192 |
| 6,121,641 A * | 9/2000 | Ohno ............................. | 257/192 |
| 6,534,790 B2 * | 3/2003 | Kuzuhara et al. ............... | 257/76 |
| 6,548,333 B2 * | 4/2003 | Smith ........................... | 438/172 |
| 6,800,878 B2 * | 10/2004 | Nambu et al. .................. | 257/194 |
| 6,841,410 B2 * | 1/2005 | Sasaoka .......................... | 438/47 |
| 6,933,544 B2 * | 8/2005 | Saito et al. .................... | 257/194 |

(Continued)

FOREIGN PATENT DOCUMENTS

| | | |
|---|---|---|
| JP | 11-261053 | 9/1999 |
| JP | 2000-208753 | 7/2000 |

(Continued)

OTHER PUBLICATIONS

Coffie et al. ("Unpassivated p-GaN/AlGaN/GaN HEMTs with 7.1 W/mm at 10 GHz", Electronics Letters, Sep. 18, 2003, vol. 39, No. 19).*

(Continued)

*Primary Examiner* — William F Kraig
(74) *Attorney, Agent, or Firm* — McDermott Will & Emery LLP

(57) ABSTRACT

A transistor includes a first semiconductor layer formed on a substrate, a second semiconductor layer formed on the first semiconductor layer and has a band gap larger than that of the first semiconductor layer, a control layer formed on the second semiconductor layer and contains p-type impurities, a gate electrode formed in contact with at least part of the control layer and a source electrode and a drain electrode formed on both sides of the control layer, respectively. A third semiconductor layer made of material having a lower etch rate than that of the control layer is formed between the control layer and the second semiconductor layer.

16 Claims, 4 Drawing Sheets

(56) References Cited

U.S. PATENT DOCUMENTS

| | | | |
|---|---|---|---|
| 7,033,912 B2* | 4/2006 | Saxler | 438/458 |
| 7,038,252 B2 | 5/2006 | Saito et al. | |
| 7,186,579 B2* | 3/2007 | Hatano et al. | 438/22 |
| 7,521,707 B2* | 4/2009 | Kawasaki et al. | 257/20 |
| 2001/0020700 A1* | 9/2001 | Inoue et al. | 257/20 |
| 2001/0035530 A1* | 11/2001 | Udagawa | 257/79 |
| 2002/0167023 A1* | 11/2002 | Chavarkar et al. | 257/194 |
| 2003/0098477 A1* | 5/2003 | Nambu et al. | 257/280 |
| 2003/0218183 A1* | 11/2003 | Micovic et al. | 257/192 |
| 2003/0219052 A1* | 11/2003 | Goodhue et al. | 372/45 |
| 2005/0001234 A1* | 1/2005 | Inoue et al. | 257/192 |
| 2005/0167775 A1* | 8/2005 | Nagy et al. | 257/500 |
| 2005/0173728 A1* | 8/2005 | Saxler | 257/192 |
| 2006/0060871 A1 | 3/2006 | Beach | |
| 2006/0108606 A1* | 5/2006 | Saxler et al. | 257/200 |
| 2006/0261371 A1* | 11/2006 | Kuroda et al. | 257/194 |
| 2006/0273347 A1 | 12/2006 | Hikita et al. | |
| 2007/0018198 A1* | 1/2007 | Brandes et al. | 257/183 |
| 2009/0121775 A1 | 5/2009 | Ueda et al. | |

FOREIGN PATENT DOCUMENTS

| | | |
|---|---|---|
| JP | 2004-273486 | 9/2004 |
| JP | 2004-273486 A | 9/2004 |
| JP | 2005-086102 | 3/2005 |
| JP | 2005-183551 | 7/2005 |
| JP | 2005-244072 A | 9/2005 |

OTHER PUBLICATIONS

Japanese Notice of Reasons for Rejection, w/ English translation thereof, issued in Japanese Patent Application No. JP 2006-019601 dated Nov. 16, 2010.

* cited by examiner

TRANSISTOR

CROSS-REFERENCE TO RELATED APPLICATION

This non-provisional application claims priority under 35 U.S.C. §119(a) of Japanese Patent Application No. 2006-019601 filed in Japan on Jan. 27, 2006, the entire contents of which are hereby incorporated by reference.

BACKGROUND OF THE INVENTION

1. Field of the Invention

The present invention relates to a transistor, in particular to a power transistor using a nitride semiconductor.

2. Description of Related Art

In recent years, active research and development have been made on the application of field effect transistors (hereinafter referred to as FETs) using a group III-V nitride compound semiconductor material such as gallium nitride (GaN) to high-frequency and high-power devices. Nitride semiconductor materials such as gallium nitride (GaN), aluminum nitride (AlN) and indium nitride (InN) are capable of producing various kinds of mixed crystal, as well as heterojunction just like conventionally used arsenic semiconductor materials such as gallium arsenide (GaAs). In particular, at the heterojunction interface of the nitride semiconductor material, high concentration carriers are generated by spontaneous and piezoelectric polarization without doping any impurities. Therefore, if the nitride semiconductor material is used, the resulting FET is likely to be a depletion mode (normally-on) FET and it is difficult to obtain an enhancement mode (normally-off) FET.

In the current power electronics market, most of the devices are normally-off and devices using the nitride semiconductor materials are also required to be normally-off.

As an example of the normally-off transistors, Japanese Unexamined Patent Publication No. 2005-244072 proposes a transistor as shown in FIG. 8 including a GaN channel layer 102, an AlGaN barrier layer 104 formed on the channel layer 102 and p-GaN control layer 106 formed on a selected part of the barrier layer 104.

With this structure, piezoelectric polarization generated at the heterointerface between the GaN channel layer 102 and the AlGaN barrier layer 104 is canceled by piezoelectric polarization generated at the heterointerface between the AlGaN barrier layer 104 and the GaN control layer 106. As a result, the concentration of two-dimensional electron gas below the GaN control layer 106 is selectively reduced, thereby achieving the normally-off characteristics.

However, the conventional transistor unfortunately involves problems of deterioration of electrical characteristics, such as reduction in maximum current ($I_{max}$) and increase in on-resistance ($R_{on}$), which are important electrical parameters of the power transistors.

The control layer 106 is formed by growing a p-AlGaN layer on the barrier layer 104 and dry-etching it using chlorine gas. The p-AlGaN layer formed as the control layer 106 and the barrier layer 104 are both made of AlGaN of the same Al composition ratio, though the doped impurities are different. Therefore, it is impossible to remove the p-AlGaN layer perfectly by etching without etching the barrier layer 104. As a result, the barrier layer 104 is etched (overetching) or the p-AlGaN layer remains on the barrier layer 104 (underetching).

When the overetching occurs, the barrier layer 104 is thinned down to reduce the concentration of the two-dimensional electron gas generated by the polarization, thereby reducing $I_{max}$. For the same reason, contact resistance of source and drain electrodes is increased and resistance between gate sources and gate drains are increased to raise $R_{on}$.

When the underetching occurs, on the other hand, the source and drain electrodes which are n-type ohmic electrodes are formed on the p-AlGaN layer residue, thereby increasing the contact resistance. Further, when a reverse bias is applied between the gate and the drain or the gate and the source, leak current is generated to pass through the p-AlGaN layer residue.

SUMMARY OF THE INVENTION

In order to solve the above-described problems, an object of the present invention is to provide a normally-off transistor which is less likely to cause deterioration of the electrical characteristics, such as reduction in maximum current and increase in on-resistance.

To achieve the above-described object, the present invention is directed to a transistor including a semiconductor layer formed between an undoped AlGaN layer and a control layer.

To be more specific, a transistor of the present invention includes: a first semiconductor layer formed on a substrate; a second semiconductor layer formed on the first semiconductor layer and has a band gap larger than that of the first semiconductor layer; a control layer formed on the second semiconductor layer and contains p-type impurities; a third semiconductor layer formed between the control layer and the second semiconductor layer; a gate electrode formed in contact with at least part of the control layer; and a source electrode and a drain electrode formed on both sides of the control layer, respectively, wherein the third semiconductor layer is made of material having a lower etch rate than that of the control layer.

According to the present invention, even in the step of forming the control layer by etching under the overetching condition, the second semiconductor layer is never thinned down because the third semiconductor layer is etched instead. Therefore, the p-type semiconductor layer does not remain on the second semiconductor layer and the second semiconductor layer is not thinned down. As a result, a normally-off transistor is obtained without deterioration of the electrical characteristics, such as reduction in $I_{max}$ and increase in $R_{on}$.

As to the transistor of the present invention, it is preferred that the first semiconductor layer, the second semiconductor layer and the control layer are made of nitrogen-containing compound semiconductors, respectively.

As to the transistor of the present invention, it is preferred that the control layer is made of $Al_xGa_{1-x}N$ ($0 \leq x \leq 1$) and the third semiconductor layer is made of $Al_yGa_{1-y}N$ ($0 \leq y \leq 1$ and $x<y$). Further, it is preferred that the control layer is made of $Al_xGa_{1-x}N$ ($0 \leq x \leq 0.1$) and the third semiconductor layer is made of $Al_yGa_{1-y}N$ ($x+0.1 \leq y \leq 1$). With this structure, the etch rate of the control layer is greatly varied from that of the third semiconductor layer.

As to the transistor of the present invention, it is preferred that the third semiconductor layer is a composition gradient layer in which the Al composition ratio decreases in the direction from the second semiconductor layer to the control layer. With this structure, valance band discontinuity at the interface between the control layer and the third semiconductor layer is reduced, thereby achieving smooth hole injection to the channel.

As to the transistor of the present invention, it is preferred that the third semiconductor layer contains p-type impurities.

With this structure, the third semiconductor layer is considered as part of the control layer in terms of operation of the transistor. In this case, it is preferred that both of the second and third semiconductor layers are made of AlGaN of the same Al composition ratio. As the second and third semiconductor layers have the same Al composition ratio, these layers are continuously formed by epitaxial growth without suspending the film growth. Thus, an excellent pn junction is obtained.

As to the transistor of the present invention, it is preferred that the third semiconductor layer is made of a compound semiconductor containing at least In. By the addition of In, the dry etch rate of the third semiconductor layer decreases. This makes it possible to achieve the normally-off transistor with stability.

As to the transistor of the present invention, it is preferred that the third semiconductor layer is made of InGaP and the second semiconductor layer is made of AlGaAs. As InGaP and AlGaAs are perfectly selectively etched by wet etching, a sufficiently thin InGaP layer is formed as the third semiconductor layer.

It is preferred that the transistor of the present invention further includes a fourth semiconductor layer formed between the substrate and the first semiconductor layer and has a band gap larger than that of the first semiconductor layer. With this structure, the holes injected from the control layer to the channel layer are prevented from flowing toward the substrate, i.e., a double hetero structure is provided.

DETAILED DESCRIPTION OF THE INVENTION (First Embodiment)

Figure 1:
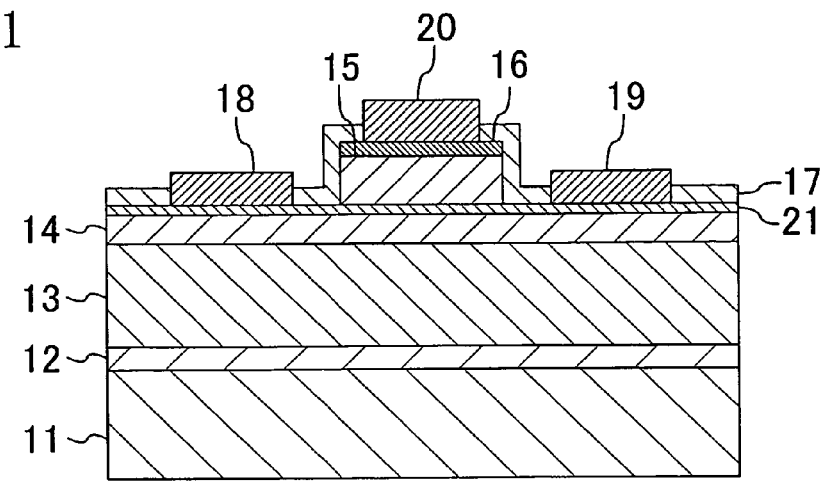
FIG. 1 is a sectional view illustrating a transistor according to a first embodiment of the present invention.

Explanation of a first embodiment is provided with reference to the drawings. FIG. 1 shows the sectional structure of a transistor according to the first embodiment. As shown in FIG. 1, the transistor of the present embodiment includes a sapphire substrate 11 having a (0001) plane as a principle surface. On the substrate 11, a 100 nm thick AlN buffer layer 12, a 2 μm thick first semiconductor layer 13 as a channel layer made of undoped GaN, a 25 nm thick second semiconductor layer 14 as a barrier layer made of undoped $Al_{0.2}Ga_{0.8}N$ and a 8 nm thick third semiconductor layer 21 made of undoped $Al_{0.5}Ga_{0.5}N$ are formed in this order.

On a selected part of the third semiconductor layer 21, a 100 nm thick p-type control layer 15 made of $Al_{0.2}Ga_{0.8}N$ containing p-type impurities is formed. The control layer 15 is doped with magnesium (Mg) at a dose of about $1\times10^{19}$ $cm^{-3}$. The carrier concentration in the control layer 15 is about $1\times10^{18}$ $cm^{-3}$.

On the control layer 15, a 5 nm thick p-type contact layer 16 made of GaN containing a larger amount of p-type impurities than the control layer 15 is formed. The p-type contact layer 16 is doped with Mg at a dose of about $1\times10^{20}$ $cm^{-3}$. The carrier concentration in the p-type contact layer 16 is about $1\times10^{19}$ $cm^{-3}$.

On the p-type contact layer 16, a gate electrode 20 made of nickel (Ni) is formed to establish ohmic contact with the p-type contact layer 16. On the third semiconductor layer 21, a source electrode 18 and a drain electrode 19 made of a Ti layer and a Al layer are formed on the sides of the gate electrode 20, respectively. The surface of the obtained structure except the surfaces of the electrodes is covered with a SiN passivation film 17.

When viewed from the top of the substrate 11, the control layer 15 and the p-type contact layer 16 are arranged in stripes of 1.5 μm width. The gate electrode 20 formed on the p-type contact layer 16 is 1 μm in width. When a voltage is not applied to the gate electrode 20, two-dimensional electron gas disappears from the channel layer below the control layer 15 due to the cancellation of the piezoelectric polarization as described above and the effect of built-in voltage generated by a pn junction. Therefore, the transistor of the present embodiment is operated in a normally-off mode.

Referring to the section of FIG. 1 taken along the gate length direction, the bottom end of the control layer 15 and the edge of the drain electrode 19 maintains a distance of not less than 5 μm is therebetween. Therefore, the breakdown voltage of the drain is sufficiently high. The material of the gate electrode 20 is not limited to Ni and any material may be used as long as the ohmic contact with the p-type contract layer 16 is established. For example, palladium (Pd) may be used.

Now, the reasons why the reduction in maximum current ($I_{max}$) and the increase in on-resistance ($R_{on}$) are prevented in the transistor of the present embodiment are explained below.

Figure 2:
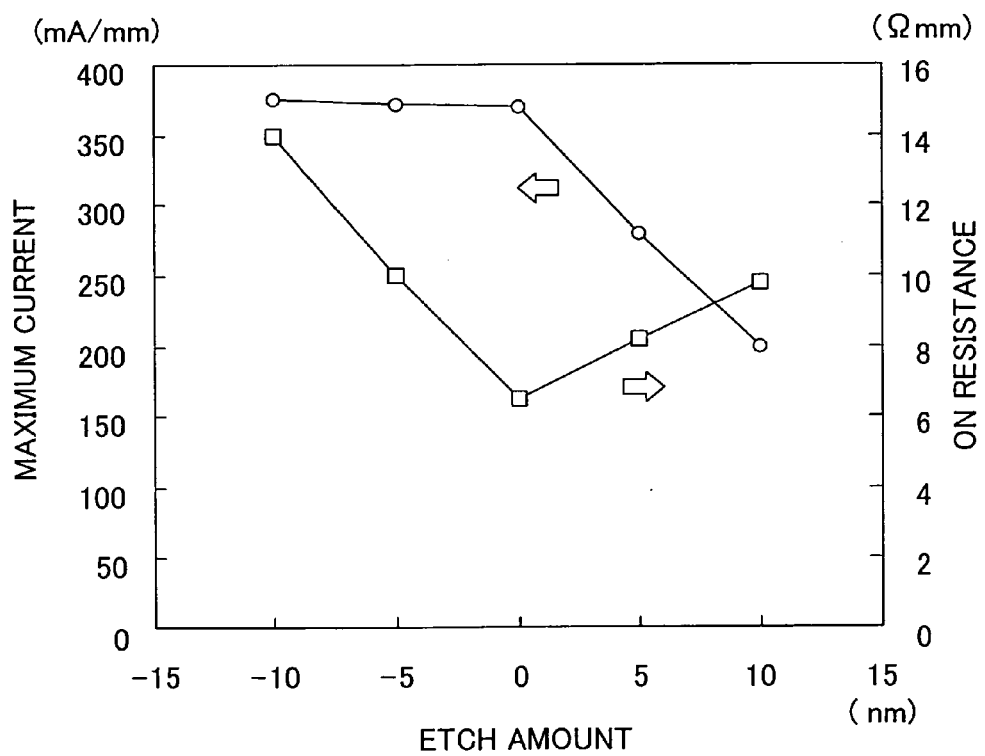
FIG. 2 is a graph illustrating the effect of the residue of a control layer and the overetching of a second semiconductor layer on the characteristics of the transistor according to the first embodiment of the present invention.

FIG. 2 shows the effect of the residue of the control layer 15 and the overetching of the second semiconductor layer 2 on $I_{max}$ and $R_{on}$, which are the important electrical characteristics of the power transistor. FIG. 2 indicates that the control layer 15 remains on the second semiconductor layer 14 when the etch amount is in a minus region, while the overetching occurs to etch the second semiconductor layer 14 when the etch amount is in a plus region.

As shown in FIG. 2, when the overetching occurs to reduce the thickness of the second semiconductor layer 14, the concentration of the two-dimensional electron gas generated by polarization is reduced, thereby reducing $I_{max}$. For the same reason, the contact resistance of the source and drain electrodes 18 and 19 is increased and the resistance between the gate sources and the gate drains is increased to raise $R_{on}$.

When the underetching occurs, on the other hand, the control layer 15 remains on the second semiconductor layer 14. As a result, the source and drain electrodes 18 and 19 which are n-type ohmic electrodes are formed on the residue of the control layer 15, thereby increasing $R_{on}$.

Therefore, in order to prevent the reduction in $I_{max}$ and the increase in $R_{on}$, it is necessary to remove unwanted part of the control layer 15 without etching the second semiconductor layer 14. However, the etching of the control layer 15 is inevitably accompanied by variations in etch amount of about ±10%. Therefore, it is impossible to avoid the underetching and the overetching.

In the transistor of the present embodiment, the thin third semiconductor layer 21 is formed between the control layer 15 and the second semiconductor layer 14. With this structure, the control layer 15 is overetched at any time such that the control layer 15 does not remain on the other part than the selected part and the second semiconductor layer 14 is not etched.

For preventing the reduction in $I_{max}$ and the increase in $R_{on}$, the composition and the thickness of the third semiconductor layer 21 are determined as follows. The control layer 15 is dry-etched under a 10% overetching condition with reference to "exact" etching, thereby preventing the underetching. Accordingly, when the overetching occurs to the maximum degree, the layer below the control layer 15 is etched by 20% together with the control layer 15. Suppose that the thickness of the control layer is t and the etch rate of the control layer 15 is r when the etch rate of the third semiconductor layer 21 is 1, the third semiconductor layer 21 below the control layer 15 is not etched away as long as the thickness thereof is not less than 0.2 t/r. Therefore, the second semiconductor layer 14 is never etched.

If the third semiconductor layer 21 is too thick, the flow of holes from the control layer 15 to the second semiconductor layer 14 is hindered by the third semiconductor layer 21. Further, the contact resistance of the source and drain electrodes 18 and 19 formed on the third semiconductor layer 21 is increased. Therefore, the third semiconductor layer 21 is preferably not more than 10 nm in thickness. The value r is preferably not less than 2 because the control layer 15 is generally about 100 nm in thickness.

Figure 3:
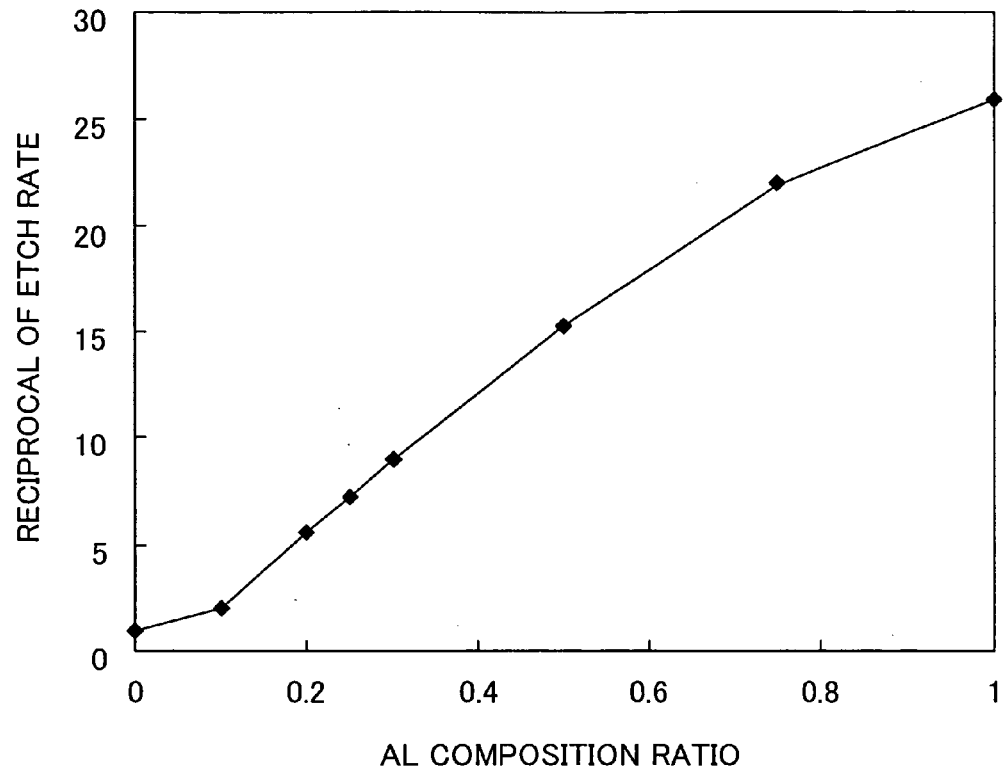
FIG. 3 is a graph illustrating a correlation between Al composition ratio in a semiconductor layer and etch rate thereof.

FIG. 3 shows a correlation between the Al composition ratio in an $Al_xGa_{1-x}N$ layer and the etch rate thereof during ICP etching. In FIG. 3, a lateral axis indicates the Al composition ratio x in the $Al_xGa_{1-x}N$ layer and the longitudinal axis indicates a reciprocal of the etch rate standardized by the GaN etch rate regarded as 1. The ICP etching is carried out by supplying chlorine gas at 15 ml/min (atmospheric pressure, 0° C.: sscm) and $SF_6$ gas at 5 sccm under the degree of in-chamber vacuum adjusted to 2.0 Pa, high frequency power of 200 W and bias voltage of 20 W.

As shown in FIG. 3, when the Al composition ratio x in the control layer 15 is $0 \leq x \leq 0.1$ and that in the third semiconductor layer 21 is not less than x+0.1, the etch rate r of the control layer 15 of not less than 2 is achieved when the etch rate of the third semiconductor layer 21 is 1.

In the transistor of the present embodiment, the control layer 15 is made of $Al_{0.2}Ga_{0.8}N$ containing 20% Al and the third semiconductor layer 21 is made of $Al_{0.5}Ga_{0.5}N$ containing 50% Al. Therefore, the value r is about 2.7 as shown in FIG. 3. Even if the control layer 15 of 100 nm in thickness is overetched by 20%, the second semiconductor layer 14 formed below the third semiconductor layer 21 is not etched at all because the third semiconductor layer 21 of 8 nm thick exists between the control layer 15 and the second semiconductor layer 14. Further, since the third semiconductor layer 21 is very thin, the holes injected from the control layer 15 to the second semiconductor layer 14 is able to tunnel the third semiconductor layer 21. Therefore, the electrical characteristics of the transistor do not deteriorate. Moreover, the increase in contact resistance of the source and drain electrodes 18 and 19 is kept small because the electrons are also able to tunnel the third semiconductor layer 21 just like the holes. Thus, the reduction in maximum current ($I_{max}$) and the increase in on-resistance ($R_{on}$) in the normally-off transistor are prevented.

Hereinafter, explanation of a method for manufacturing the transistor of the present embodiment is provided. First, on a (0001) plane of a sapphire substrate 11, a buffer layer 12, a first semiconductor layer 13, a second semiconductor layer 14, a third semiconductor layer 21, an $Al_{0.2}Ga_{0.8}N$ layer as a control layer 15 and a GaN layer as a p-type contact layer 16 are formed in this order by metal-organic chemical vapor deposition (MOCVD). The p-type $Al_{0.2}Ga_{0.8}N$ layer and the GaN layer may be added with Mg in advance or Mg may be implanted therein by ion-implantation after the deposition.

Then, dry etching using inductively coupled plasma (ICP) of chlorine gas and $SF_6$ gas is carried out to remove the p-type $Al_{0.2}Ga_{0.8}N$ layer and the GaN layer selectively such that only the selected parts of them remain as the control layer and the p-type contact layer, respectively. For example, the dry etching may be carried out by supplying the chlorine gas at 15 sccm and the $SF_6$ gas at 5 sccm under the degree of in-chamber vacuum of 2.0 Pa, high frequency power of 200 W and bias voltage of 20 W.

As described above, the dry etching is carried out to overetch the p-type $Al_{0.2}Ga_{0.8}N$ layer, thereby removing part of the p-type $Al_{0.2}Ga_{0.8}N$ layer which does not serve as the control layer. Further, the composition and thickness of the third semiconductor layer 21 are adjusted such that the third semiconductor layer 21 remains on the second semiconductor layer 14 to prevent the second semiconductor layer 14 from thinning down.

Then, a passivation film 17 made of SiN is formed on the entire surface of the substrate by CVD using silane gas ($SiH_4$), ammonia gas ($NH_3$) and nitrogen gas ($N_2$).

Then, openings are formed in parts of the passivation film 17 on both sides of the control layer 15 by reactive ion etching (RIE). Then, a source electrode 18 and a drain electrode 19 made of a Ti layer and an Al layer are formed in the openings and subjected to heat treatment at 650° C. under $N_2$ atmosphere.

Then, the passivation film 17 is selectively removed by RIE to form an opening for exposing the p-type contact layer 16 and a gate electrode 20 made of Ni is formed in the opening in the passivation film 17.

The above-mentioned sapphire substrate having the (0001) plane as a principle plane may be replaced with any substrate, such as a silicon carbide (SiC) substrate, a gallium nitride (GaN) substrate or a silicon (Si) substrate. The plane direction of the substrate is not particularly limited as long as a semiconductor layer is grown thereon with high crystallinity.

Figure 4:
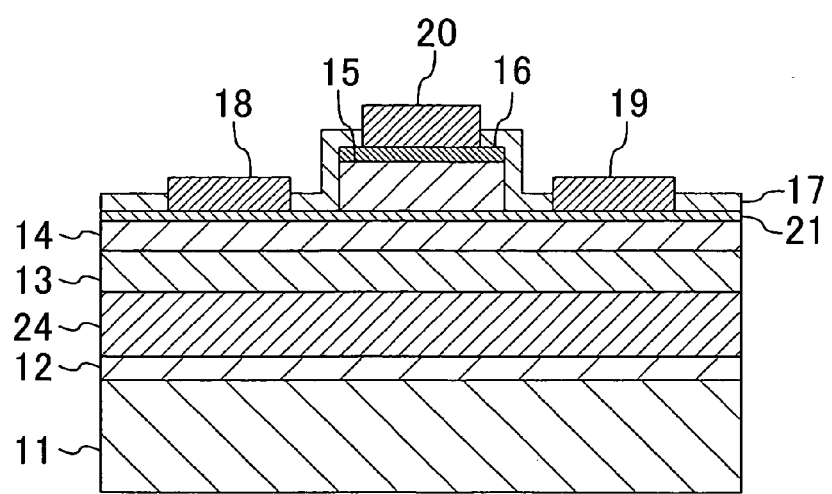
FIG. 4 is a sectional view illustrating a transistor according to a first modification of the first embodiment of the present invention.
Figure 5:
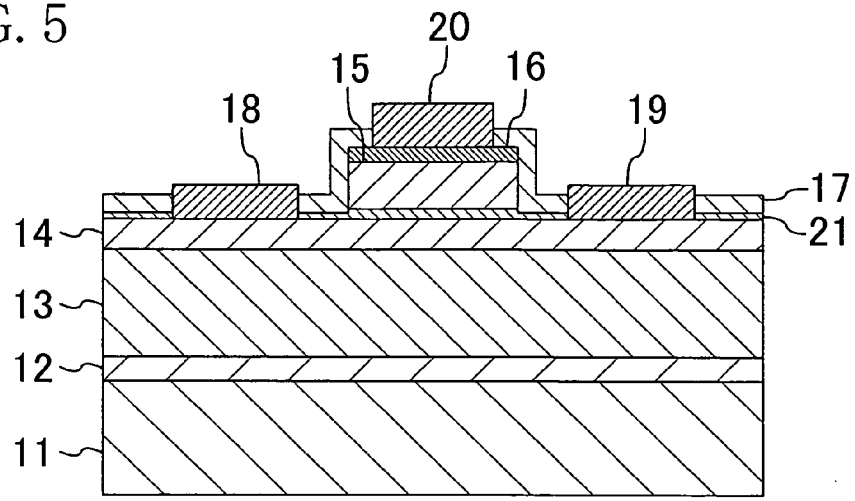
FIG. 5 is a sectional view illustrating a transistor according to a second modification of the first embodiment of the present invention.

In the present embodiment, the second semiconductor layer 14 made of AlGaN is stacked on the first semiconductor layer 13 made of GaN such that the top of the GaN layer is covered with the AlGaN layer. However, as shown in FIG. 4, when a GaN layer of about 50 nm thick is used as the first semiconductor layer 13, a fourth semiconductor layer 24 made of AlGaN may be provided between the substrate 11 and the first semiconductor layer 13 such that the GaN layer is sandwiched between the AlGaN layers having a larger band gap than that of the GaN layer. With this structure, the holes injected from the control layer to the channel layer when appositive bias is applied to the gate electrode are prevented from flowing toward the substrate, i.e., a double hetero structure is provided. As a result, the electrons are generated to maintain neutrality of charges, thereby improving $I_{max}$. This structure is particularly effective when a conductive substrate is used.

The control layer 15 of the present embodiment is made of an $Al_{0.2}Ga_{0.8}N$ layer, but it may be made of an $Al_xGa_{1-x}N$ layer ($0 \leq x \leq 0.1$). If the $Al_{0.2}Ga_{0.8}N$ layer containing 20% Al is used as the control layer 15, the flow of the electrons from the channel layer to the control layer 15 when a forward bias is applied is hindered due to the difference in band gap between the $Al_{0.2}Ga_{0.8}N$ layer and the GaN channel layer. On the other hand, when the $Al_xGa_{1-x}N$ layer ($0 \leq x \leq 0.1$) is used as the control layer 15, the gate current is raised. However, etching selectivity between the control layer 15 and the third semiconductor layer 21 is further increased, thereby achieving the normally-off transistor with stability.

The use of the $Al_xGa_{1-x}N$ layer ($0 \leq x \leq 0.1$) as the control layer 15 reduces the Al composition ratio in the third semiconductor layer 21. For example, when the composition of the third semiconductor layer 21 is $Al_{0.2}Ga_{0.8}N$, the second and third semiconductor layers 14 and 21 have the same Al composition ratio. Therefore, the second and third semiconductor layers 14 and 21 are formed continuously by MOCVD without interrupting the film growth. This makes it possible to obtain an excellent growth interface and improve the transistor characteristics.

In terms of crystal growth techniques, the $Al_xGa_{1-x}N$ layer ($0 \leq x \leq 0.1$) in which the Al composition ratio is 10% or lower is likely to achieve excellent crystallinity. Therefore, the $Al_xGa_{1-x}N$ layer ($0 \leq x \leq 0.1$) effectively solves the problem of crystal defect caused by use of an Al-rich AlGaN layer as the control layer and its attendant increase in gate leak current.

The third semiconductor layer 21 may be a composition gradient semiconductor layer in which the Al composition ratio gradually decreases in the direction from the second semiconductor layer 14 to the control layer 15. By so doing, valance band discontinuity at the interface between the control layer 15 and the third semiconductor layer 21 is reduced, thereby achieving smooth hole injection to the channel.

In the present embodiment, the source and drain electrodes 18 and 19 are formed on the third semiconductor layer 21 made of an undoped $Al_{0.5}Ga_{0.5}N$ layer. However, parts of the third semiconductor layer 21 may be removed by etching to form the source and drain electrodes 18 and 19 on the second semiconductor layer 14.

The undoped $Al_{0.5}Ga_{0.5}N$ layer used as the third semiconductor layer 21 in the present embodiment may be added with In as a group III element such that an undoped InAlGaN layer is used as the third semiconductor layer 21. By the addition of In, the dry etch rate of the third semiconductor layer 21 is reduced as compared with that of the p-type $Al_{0.2}Ga_{0.8}N$ control layer 15. Therefore, the normally-off transistor is achieved with stability.

The undoped third semiconductor layer 21 used in the present embodiment may be p-doped as long as the source and drain electrodes 18 and 19 are formed in contact with the second semiconductor layer 14 exposed in the openings formed in the third semiconductor layer 21.

For example, when the control layer 15 is made of p-type GaN, the third semiconductor layer 21 is made of p-type $Al_{0.2}Ga_{0.8}N$ and the second semiconductor layer 14 is made of undoped $Al_{0.2}Ga_{0.8}N$, the second and third semiconductor layers 14 and 21 have the same Al composition ratio. Therefore, the second and third semiconductor layers 14 and 21 are epitaxially grown in a continuous manner without interrupting the film growth. Thus, an excellent pn junction is obtained at the interface between the second and third semiconductor layers 14 and 21. The control layer 15 made of p-type GaN and the third semiconductor layer 21 made of p-type $Al_{0.2}Ga_{0.8}N$ show the selectivity of about 5.5 as shown in FIG. 3. Therefore, the normally-off transistor is obtained with high yield and high stability. In terms of operation, the third semiconductor layer 21 is considered as part of the control layer 15. Further, as the source and drain electrodes 18 and 19 are deposited in the openings formed in the third semiconductor layer 21 by etching such that they are in contact with the second semiconductor layer 14, the contact resistance of the source and drain electrodes 18 and 19 is reduced.

(Second Embodiment)

Figure 6:
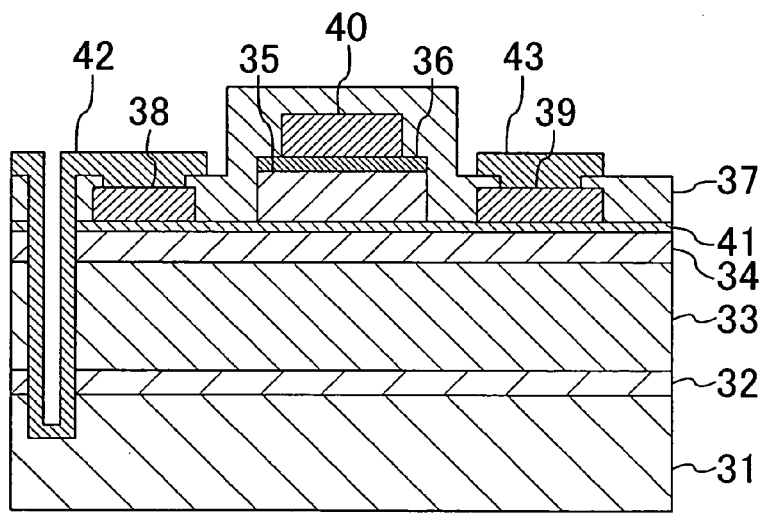
FIG. 6 is a sectional view illustrating a transistor according to a second embodiment of the present invention.

Hereinafter, explanation of a second embodiment of the present invention is provided with reference to the drawings. FIG. 6 shows the sectional structure of a transistor according to the second embodiment. As shown in FIG. 6, the transistor of the present embodiment includes a Si substrate 31 having a (111) plane as a principle surface. On the substrate 31, a 40 nm thick AlN buffer layer 32, a 1 μm thick first semiconductor layer 33 made of undoped GaN, a 25 nm thick second semiconductor layer 34 made of undoped $Al_{0.2}Ga_{0.8}N$ and a 8 nm thick third semiconductor layer 41 made of undoped $Al_{0.5}Ga_{0.5}N$ are formed in this order.

On a selected part of the third semiconductor layer 41, a 100 nm thick control layer 35 made of $Al_{0.2}Ga_{0.8}N$ containing p-type impurities is formed. The control layer 35 is doped with magnesium (Mg) at a dose of about $1 \times 10^{19}$ cm$^{-3}$. The carrier concentration in the control layer 35 is about $1 \times 10^{18}$ cm$^{-3}$.

On the control layer 35, a 5 nm thick p-type contact layer 36 made of GaN containing a larger amount of p-type impurities than the control layer 35 is formed. The p-type contact layer 36 is doped with Mg at a dose of about $1 \times 10^{20}$ cm$^{-3}$. The carrier concentration in the p-type contact layer 36 is about $1 \times 10^{19}$ cm$^{-3}$.

On the p-type contact layer 36, a gate electrode 20 made of nickel (Ni) is formed to establish ohmic contact with the p-type contact layer 36. On the third semiconductor layer 41, a source electrode 38 and a drain electrode 39 made of a Ti layer and a Al layer are formed on the sides of the gate electrode 20, respectively. The surface of the obtained structure except the surfaces of the electrodes is covered with a SiN passivation film 37. For the purpose of reducing resistance of interconnections connected to the electrodes, the source electrode 38 is electrically connected to the substrate 31 through a via 42 penetrating the third semiconductor layer 41, the second semiconductor layer 34, the first semiconductor layer 33 and the buffer layer 32. Further, the drain electrode 39 is electrically connected to a metallic interconnection 43.

In the transistor of the present embodiment, both of the second semiconductor layer 34 and the control layer 35 are made of AlGaN containing 20% Al. However, their Al composition ratios may be varied.

(Third Embodiment)

Figure 7:
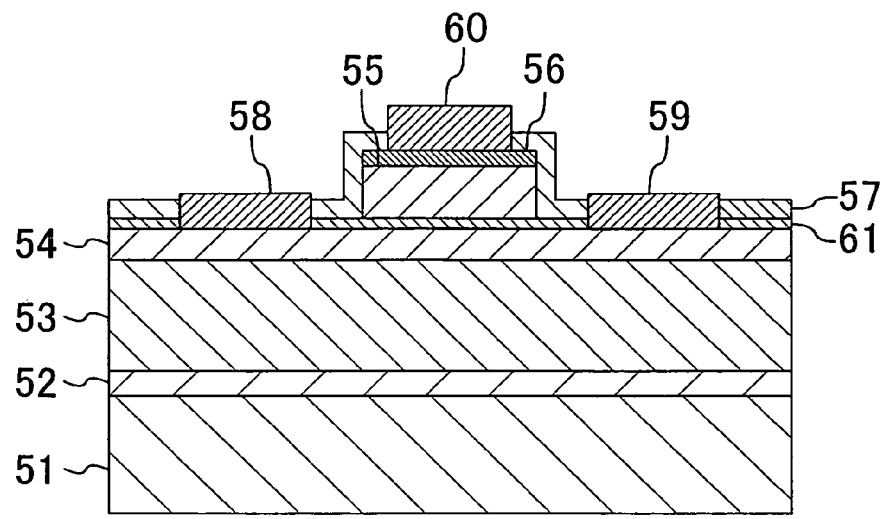
FIG. 7 is a sectional view illustrating a transistor according to a third embodiment of the present invention.
Figure 8:
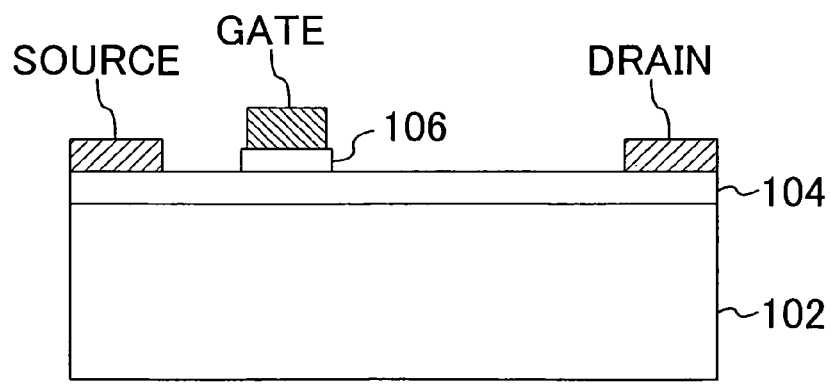
FIG. 8 is a sectional view illustrating a conventional transistor.

Hereinafter, explanation of a third embodiment of the present invention is provided with reference to the drawings. FIG. 7 shows the sectional structure of a transistor according to the third embodiment. As shown in FIG. 7, the transistor of the present embodiment includes a gallium arsenide (GaAs) substrate 51. On the substrate 51, a buffer layer 52 made of a supperlattice including alternately stacked GaAs layers and aluminum gallium arsenide (AlGaAs) layers, a first semiconductor layer 53 made of undoped GaAs, an n-doped $Al_{0.2}Ga_{0.8}As$ layer 54 and a third semiconductor layer 61 made of undoped indium gallium phosphide (InGaP) are formed in this order.

On a selected part of the third semiconductor layer 61, a control layer 55 made of $Al_{0.2}Ga_{0.8}As$ containing p-type impurities is formed. On the control layer 55, a p-type contact layer 56 made of GaAs containing a larger amount of p-type impurities than the control layer 55 is formed.

On the p-type contact layer 56, a gate electrode 60 made of titanium (Ti), platinum (Pt) and gold (Au) is formed to establish ohmic contact with the p-type contact layer 56. On the third semiconductor layer 61, a source electrode 58 and a drain electrode 59 made of a gold/germanium (AuGe) alloy, nickel (Ni) and gold (Au) are formed on the sides of the gate electrode 60, respectively. The surface of the obtained structure except the surfaces of the electrodes is covered with a SiN passivation film 57.

In the present embodiment, with use of a mixture solution of phosphoric acid, hydrogen peroxide water and water, the $Al_{0.2}Ga_{0.8}As$ control layer 55 is etched with complete selectivity to the third semiconductor layer 61 made of undoped InGaP. This makes it possible to achieve the normally-off transistor with stability.

As described above, the present invention makes it possible to achieve a normally-off transistor which is less likely to cause significant deterioration of electrical characteristics, such as reduction in maximum current and increase in on-resistance. The transistor of the present invention is useful as a power transistor using a nitride semiconductor or the like.

What is claimed is:

1. A transistor comprising:
   a first semiconductor layer formed on a substrate;
   a second semiconductor layer formed directly on the first semiconductor layer and has a band gap larger than that of the first semiconductor layer;
   a control layer selectively formed on the second semiconductor layer and contains p-type impurities;
   a third semiconductor layer formed between the control layer and the second semiconductor layer;
   a gate electrode formed on the control layer; and
   a source electrode and a drain electrode formed on both sides of the control layer, respectively,
   wherein the third semiconductor layer has a band gap larger than that of the second semiconductor layer,
   the control layer is apart from the source electrode and the drain electrode,
   the source electrode and the drain electrode are in direct contact with the third semiconductor layer,
   the first semiconductor layer, the second semiconductor layer and the control layer are made of nitrogen-containing compound semiconductors, respectively,
   a length of the control layer is shorter than a length of the third semiconductor layer, a length of the first semiconductor layer and a length of the second semiconductor layer, in a direction perpendicular to a thickness direction,
   a thickness of the control layer is larger than a thickness of the second semiconductor layer, and
   a thickness of the second semiconductor layer is larger than a thickness of the third semiconductor layer.

2. The transistor of claim 1, wherein
   the control layer is made of $Al_xGa_{1-x}N$ ($0 \leq x \leq 1$)
   the third semiconductor layer is made of $Al_yGa_{1-y}N$ ($0 \leq y \leq 1$ and $x < y$).

3. The transistor of claim 2, wherein
   the control layer is made of $Al_xGa_{1-x}N$ ($0 \leq x \leq 0.1$)
   the third semiconductor layer is made of $Al_yGa_{1-y}N$ ($x+0.1 \leq y \leq 1$).

4. The transistor of claim 1, wherein the third semiconductor layer contains p-type impurities.

5. The transistor of claim 4, wherein the control layer is in contact with the third semiconductor layer.

6. The transistor of claim 5, wherein the third semiconductor layer is in contact with the second semiconductor layer.

7. The transistor of claim 1, wherein the third semiconductor layer is made of a compound semiconductor containing at least In.

8. The transistor of claim 1, further comprising a fourth semiconductor layer formed between the substrate and the first semiconductor layer and has a band gap larger than that of the first semiconductor layer.

9. The transistor of claim 1, wherein an Al composition ratio is substantially uniform in each of the second semiconductor layer and the third semiconductor layer.

10. The transistor of claim 1, wherein the third semiconductor layer is a composition gradient layer in which the Al composition ratio gradually decreases in the direction from the second semiconductor layer to the control layer.

11. The transistor of claim 1, wherein the third semiconductor layer is made of material having a lower etch rate than that of the control layer.

12. The transistor of claim 1, wherein the third semiconductor layer has a single composition throughout.

13. The transistor of claim 1, further comprising a passivation film in contact with a side portion of the gate electrode and a side portion of the control layer.

14. The transistor of claim 13, wherein a thickness of the passivation film is larger than the thickness of the third semiconductor layer.

15. A transistor comprising:
   a first semiconductor layer formed on a substrate;
   a second semiconductor layer formed directly on the first semiconductor layer and has a band gap larger than that of the first semiconductor layer;
   a control layer selectively formed on the second semiconductor layer and contains p-type impurities;
   a third semiconductor layer formed between the control layer and the second semiconductor layer;
   a gate electrode formed on the control layer; and
   a source electrode and a drain electrode formed on both sides of the control layer, respectively, wherein:
   the third semiconductor layer is made of material having a lower etch rate than that of the control layer, and has a band gap larger than that of the second semiconductor layer,
   the control layer is apart from the source electrode and the drain electrode,
   the source electrode and the drain electrode are in contact with the third semiconductor layer,
   the first semiconductor layer, the second semiconductor layer and the control layer are made of nitrogen-containing compound semiconductors, respectively, and
   the third semiconductor layer is a composition gradient layer in which the Al composition ratio gradually decreases in the direction from the second semiconductor layer to the control layer.

16. A transistor comprising:
   a first semiconductor layer formed on a substrate;
   a second semiconductor layer formed directly on the first semiconductor layer and has a band gap larger than that of the first semiconductor layer;
   a control layer selectively formed on the second semiconductor layer and contains p-type impurities;
   a third semiconductor layer formed between the control layer and the second semiconductor layer;
   a gate electrode formed on the control layer; and
   a source electrode and a drain electrode formed on both sides of the control layer, respectively,
   wherein the third semiconductor layer has a band gap larger than that of the second semiconductor layer, the control layer is apart from the source electrode and the drain electrode,
the source electrode and the drain electrode are in direct contact with the third semiconductor layer,
the first semiconductor layer, the second semiconductor layer and the control layer are made of nitrogen-containing compound semiconductors, respectively,
a thickness of the control layer is larger than a thickness of the second semiconductor layer, and
a thickness of the second semiconductor layer is larger than a thickness of the third semiconductor layer.

* * * * *